ELECTRICAL TIME-DELAY NETWORK

Filed Sept. 25, 1948

INVENTOR
STEPHEN V. HART
BY Morris A. Rabkin
ATTORNEY

Patented Apr. 8, 1952

2,591,810

UNITED STATES PATENT OFFICE 2,591,810

ELECTRICAL TIME-DELAY NETWORK

Stephen V. Hart, Haddonfield, N. J., assignor to Radio Corporation of America, a corporation of Delaware Application September 25, 1948, Serial No. 51,233

13 Claims. (Cl. 250—36)

Figure 1:
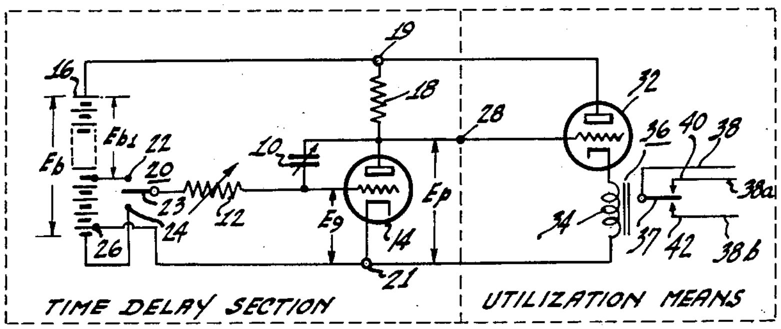

This invention relates to improvements in electrical time delay networks, and more particularly to improved circuits or networks for obtaining relatively long time delays.

It is well known that the charge or discharge of a capacitor through a resistor may be used to obtain controllable time delays in electrical circuits, as, for example, where it is desired to initiate some circuit action at a controlled time interval after the occurrence of a switching or keying action. The rate at which the capacitor may be charged and/or discharged through the resistor is dependent on the capacitance and resistance of the elements used. In some instances, a voltage or current sensitive device is arranged to be operated by the voltage across the capacitor, and will respond when the capacitor voltage reaches some predetermined level. In other cases, the changing voltage across the capacitor may be used directly, as to provide a time base for an oscillograph or other similar purposes.

A principal difficulty encountered in such time delay arrangements resides in the fact that the duration of the time delay which can be obtained is limited by the size of the resistors and capacitors. For time delays of the order of a few seconds or less, standard and readily available capacitors and resistors may be used. However, when it is desired to obtain a time delay of many seconds or even minutes, the relative size of the resistors and capacitors required is objectionable from the standpoints of weight, bulk, accuracy, and cost.

It is, accordingly, a principal object of the present invention to provide improved networks for obtaining long, controlled time delays, using standard, readily available circuit elements.

Another object of the invention is to provide an improved electronic tube circuit for increasing the time delay action and the stability of time delay devices.

Yet another object of the invention is to provide improved delayed action relay control circuits.

A further object of the invention is to provide an improved time delay circuit in which the reactance value of a controlling element thereof is effectively amplified in a predetermined manner, whereby extended time delays may be obtained with a minimum number of components of relatively small size and low cost.

According to the invention, the foregoing and other objects and advantages are obtained with resistor-capacitor time delay elements used in conjunction with an electronic tube amplifier circuit, the arrangement being such that the voltages across the capacitor, the resistor, and the tube interact to provide time delays much greater than would be expected from the time constant of the resistor-capacitor combination alone. Viewed in a slightly different manner, time delay circuits arranged in accordance with the invention are effective to vary the total available voltage change for a capacitor which is charging or discharging through a resistor, during the charging or discharging process, and hence are effective to increase the time delays attainable with relatively small resistors and capacitors.

Figure 2:
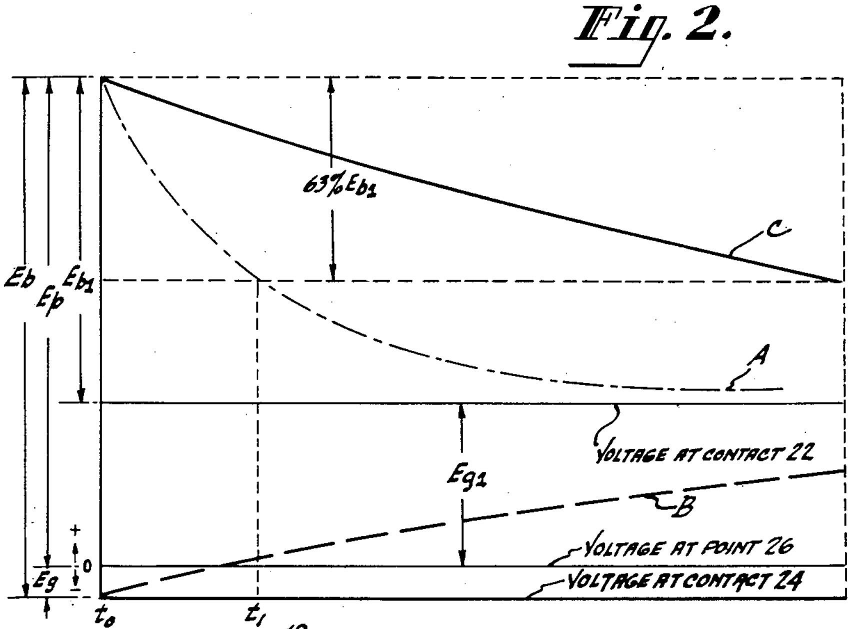
Figure 3:
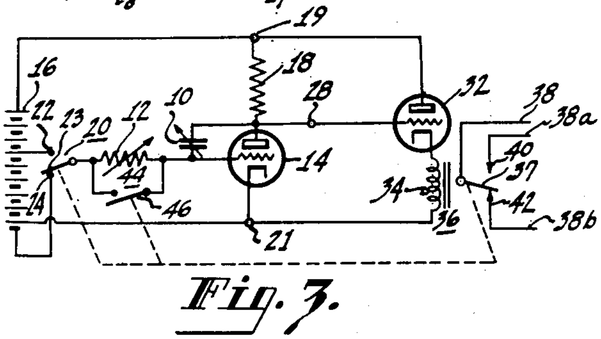

A more complete understanding of the invention may be had by reference to the following description of illustrative embodiments thereof, when considered in connection with the accompanying drawings in which:

Figure 1 illustrates a time delay relay control circuit arranged in accordance with the invention, Figure 2 is a chart representing graphically the voltage and time relationships for the circuit of Figure 1, together with a voltage change curve typical of conventional time delay circuits, and Figure 3 illustrates an oscillatory relay control system arranged in accordance with the invention to have a relatively long, unsymmetrical oscillatory period.

Since the principles of the invention are applicable to time delay circuits involving either capacitor charging or capacitor discharging, or both, a single circuit, arranged in accordance with the invention, has been selected to illustrate both such modes of operation, although, as will be shown hereinafter, circuits involving the principles of the invention can be arranged readily either for delayed capacitor charging or for delayed capacitor discharging alone.

Referring to Figure 1, it is contemplated that a capacitor 10 is to be charged and discharged through a resistor 12 from a voltage source, such as a battery 16, by a switching means 20 having contacts, 22 and 24, through which the resistor-capacitor combination may be connected to intermediate and low voltage points, respectively, on the battery 16. In the circuit as thus far described, if the upper plate of the capacitor 10 were to be connected directly to the high voltage terminal of the battery 16, a more or less conventional time delay circuit would be obtained, in which the capacitor 10 would discharge exponentially from an initial voltage $E_b$ to a lower voltage $E_{b1}$ if the switch arm 23 were to be moved from the contact 24 to the contact 22. In the chart of Figure 2, wherein voltages are plotted as ordinates against time as the abscissa, such a voltage change is illustrated by the dot-and-dash curve A. As is well known, the time delay for a conventional resistor-capacitor circuit of the type just described may be expressed as a time constant RC, where R is the resistance of the resistor in ohms, and C is the capacitance of the capacitor in farads. The constant RC expresses the time required for the voltage across the capacitor to change by an amount equal to 63% of the total expected change in capacitor voltage, and this time may be insufficient for certain applications.

In accordance with the invention, and as shown in Figrue 1, the delay time of an RC circuit may be increased by connecting the capacitor 10 between the plate and the grid electrodes of an electronic tube, such as an ordinary triode tube 14, to take advantage of the amplifying action of such tube in a manner to be described. For the sake of simplicity, the element 12 is shown and referred to as a resistor, although it will be understood that any impedance element having a substantial resistive component could be used as well. The anode of the tube 14 is connected to the high voltage end of the source 16 through a plate load resistor 18 and a voltage input terminal 19, while the cathode of the tube 14 is returned to a point 26 on the source 16 slightly above the low voltage end thereof through a terminal 21, which terminal also serves as one of the output terminals for the time delay section of the network.

The output from the time delay section of the circuit of Figure 1 will comprise the voltage available across the tube 14 at the terminal 21 and an output terminal 28. While any desired voltage-sensitive utilization device having a sufficiently high input impedance may be connected across the terminals 21 and 28, one simple utilization circuit which may be used includes a second electronic tube 32 arranged to be energized from the voltage source 16 through the terminals 19 and 21 and having its grid voltage determined by the voltage across the tube 14. The operating winding 34 of a current sensitive relay 36 may be connected in the cathode circuit of the tube 32 to operate as a control device for any desired circuits which may be connected to the leads 38, 38*a*, and 38*b*. As is obvious, a circuit may be completed through the tongue 37 and either the upper contact 40 or the lower contact 42 of the relay, depending on the amount of current flowing through the tube 32 and the relay winding 34.

As was previously mentioned, the circuit of Figure 1 is adapted to provide relatively long time delays when the capacitor 10 is either charged or discharged through the resistor 12. In considering how these delays are obtained, the following points should be noted with reference to the circuit shown in Figure 1:

First, it will be seen that there are two stable conditions for the circuit of Figure 1, each of which corresponds to one of the two possible positions of the switch arm 23. Thus, with the switch arm 23 engaging the contact 24, a stable condition will eventually be reached in which the tube 14 will be drawing very little current due to negative grid bias, and in which the capacitor 10 will be charged to substantially the full voltage $E_b$ of the source 16. The voltage across the tube 14 at the output terminals 21, 28 will also be high, resulting in the application of a large positive bias to the grid of the tube 32, which bias, in turn, will cause the tube 32 to draw a large current. Therefore, the current through the tube 32 and the relay winding 34 will be sufficient to energize the relay 36, whereby the tongue 37 of the relay will be held in engagement with the upper relay contact 40, completing a circuit therethrough. This condition will be referred to hereinafter as the "capacitor charged condition." On the other hand, when the switch arm 23 engages the contact 22, a second stable condition will eventually be reached in which the tube 14 will be drawing a large current due to positive grid bias, and the capacitor 10 will be almost completely discharged. The voltage across the tube 14 at the output terminals 21, 28 will be quite low, resulting in the application of a small bias to the grid of the tube 32, which bias, in turn, will cause the tube 32 to draw a small current insufficient to energize the relay 36. As a result, the tongue 37 of the relay will drop out of engagement with the upper relay contact 40 and into engagement with the lower relay contact 42, completing a circuit therethrough. This condition will hereinafter be referred to as the "capacitor discharged condition."

Secondly, for any steady state condition in the circuit of Figure 1, the voltage across the capacitor 10 will be the difference between (1) the voltage at the arm of the switch 20 and (2) the voltage at the plate of the tube 14 (terminal 28). Hence, any change in voltage at either of these two critical points will cause a transient condition to exist, which transient condition will only be terminated when the two critical voltages are stabilized and the capacitor voltage has become adjusted to the new set of controlling conditions.

Prior art time delay circuits of the type previously mentioned generally provide that a capacitor should be charged or discharged between two predetermined voltage conditions, which conditions are selectively established prior to the charging or discharging action, and do not change during this action. In such circuits, the capacitor can either be charged to a final voltage (which final voltage does not change during the charging action), or can be discharged to a final voltage (which final voltage similarly does not change during the discharging action). In the circuit of Figure 1, however, it will be observed that the voltage at one of the two previously specified critical points (which determine the voltage toward which the capacitor 10 will charge or discharge) actually changes during the charging or discharging action. For example, it may be assumed that the circuit of Figure 1 has become stabilized with the switch arm 23 engaging the contact 24, and that the circuit is, therefore, in the "capacitor-charged condition." When the arm 23 of the switch 20 is moved to engage the contact 22, a more positive bias voltage will be made available for the grid of the tube 14 through the resistor 12, which voltage will tend to increase the flow of current through the tube 14 and the load resistor 18, and hence tend to reduce the voltage $E_p$ across the tube 14. However, the voltage across the capacitor 10 cannot change instantaneously, but must be dissipated by current flow through the resistor 12, and hence the voltage at the grid of the tube 14 does not rise instantaneously when the switch 20 is actuated but can only change gradually as the capacitor 10 discharges through the resistor 12. This gradual change in grid voltage, in turn, causes a gradual decrease in the voltage $E_p$ at the plate of the tube 14, and hence, as the plate voltage $E_p$ gradually decreases, the voltage towards which the capacitor 10 is discharging will also be decreasing. Therefore, the change in capacitor voltage occurs at a much lower rate in the circuit of Figure 1 than would be the case if the tube 14 and the resistor 18 were not in the circuit, for the reason that the final voltage towards which the capacitor is discharging is a voltage which varies gradually as the capacitor discharges, rather than an abruptly applied voltage change.

The foregoing action is illustrated on the graph of Figure 2, wherein the changes in the grid voltage $E_g$ and in the plate voltage $E_b$ of the tube 14 are shown by the lines B and C, respectively, for a period of time subsequent to movement of the switch arm 23 from the contact 24 to the contact 22 at a time $t_0$. In the case selected for illustration, the magnitude of the capacitor 10 and the resistor 12 used to obtain the curves B and C were assumed to be the same as would give the theoretical curve A and, as shown in Figure 2, the time delay available with such components in the circuit of Figure 1 is increased by a factor of approximately five as compared with the results to be expected with the same components in a conventional time delay circuit. This factor was purposely made small in order that such comparative results could be shown on the graph of Figure 2. It will also be noted that, for any given period of time after the time $t_0$, the voltage change represented by the curve C is considerably more linear than the voltage change represented by the curve A. Thus, time delay circuits arranged in accordance with the invention are adapted to provide substantially linear voltage changes.

In order to compute the time constant for a time delay circuit of the type illustrated in Figure 1, it can readily be shown that such time constant can be expressed by $RC(1+A)$, where R is the resistance of the resistor 12, C is the capacitance of the capacitor 10, and A is the amplification due to the tube 14. It will be understood that the constant A will be dependant mainly on the amplification factor of the tube and the size of the plate load resistor 18, and may be computed in the usual manner for the particular circuit parameters used. As a practical example, for a circuit in which R equals 1 megohm, C equals 1 microfarad, and A equals 70, the available time constant would be 71 seconds. It will be understood that the time constant for the circuit of Figure 1 can be varied by varying the capacitance of the capacitor 10 or the resistance of the resistor 12, or both, as desired. Moreover, small changes in either the capacitor 10 or the resistor 12 will result in comparatively large changes in the time constant of the circuit due to the amplifying action of the tube 14.

The transition of the circuit of Figure 1 from the "capacitor discharged condition" to the "capacitor charged condition" is quite analogous to the discharge action which has already been explained, except that the capacitor voltage and the plate voltage of the tube 14 will be slowly increasing rather than decreasing, while the grid voltage of the tube 14 will be decreasing rather than increasing. It is believed that this action of the circuit will be sufficiently clear without further detailed explanation. This transition will, of course, be a relatively slow process in accordance with the principles set forth above.

Referring to Figure 3, there is shown a circuit illustrating the principles of the invention as they might be applied in an oscillatory relay control network to obtain long delay action only during the capacitor charging portion of the cycle. In this case, the arm 23 of the switch 20 is mechanically linked to the tongue 37 of the relay 36, whereby the switch 20 will be actuated in response to changes in position of the relay tongue 31. A shorting switch 44 is also provided in parallel with the resistor 12, and the arm 46 of the switch 44 is mechanically linked to the arm 23 of the switch 20 and to the tongue 31 of the relay 36, so that the switches 20 and 44 will both be operated in synchronism with the relay tongue 37. In the circuit of Figure 3, when the current through the relay winding 34 is insufficient to hold the tongue 37 in engagement with the upper contact 40, the relay tongue 37 will drop down to engage the lower contact 42, thereby opening the shorting switch 44 and moving the switch arm 23 into engagement with the contact 24. This will initiate delayed charging of the capacitor 10 and will eventually result in a sufficient rise in voltage at the plate of the tube 14 (terminal 28) to cause energizing current for the relay 36 to flow through the tube 32 and the relay winding 34. As the relay tongue 37 moves up to engage the contact 40 in response to the flow of energizing current through the winding 34, the switch arm 23 will be moved up to engage the contact 22 and the shorting switch 46 will be closed, resulting in rapid discharge of the capacitor 10 and consequent deenergizing of the relay 36. Thus, the network of Figure 3 will provide an oscillatory action in which a circuit will be recurrently established through the contact 40 of the relay 36 for relatively short intervals, while a circuit will be recurrently established through the contact 42 for relatively long intervals.

Since many changes could be made in the circuits shown and described, within the scope and spirit of the invention, the foregoing is to be construed as illustrative, and not in a limiting sense.

What is claimed is:

1. An electrical time delay network comprising a plurality of input terminals adapted to be connected to a source of operating voltage, an electronic tube having anode, grid, and cathode electrodes, a capacitor connected between said anode and said grid electrodes, a grid circuit for said tube comprising (1) a resistive impedance and (2) means for selectively establishing a charging and a discharging circuit for said capacitor from said capacitor to said source through selected ones of said input terminals, said impedance being included in at least one of said charging and discharging circuits, and an output circuit for said tube including voltage sensitive utilization means connected in said output circuit.

2. An elecrtical time delay network as defined in claim 1 wherein said charging circuit includes said impedance.

3. An electrical time delay network as defined in claim 1 wherein said impedance is included in said charging and said discharging circuits.

4. An electrical time delay network as defined in claim 1 wherein said output circuit comprises (1) a second electronic tube and (2) a current-sensitive relay connected in circuit with said second tube, and a mechanical connection from said relay to said selecting means for operating said selecting means in synchronism with operation of said relay.

5. An electrical time delay network as defined in claim 1 wherein said output circuit comprises (1) a second electronic tube having an anode, a grid, and a cathode, said last mentioned grid being connected to the anode of said first named tube, (2) a cathode circuit for said second tube, and (3) a current sensitive relay having an operating winding, said operating winding being included in said cathode circuit, and a mechanical connection from said relay to said selecting means for operating said selecting means in synchronism with operation of said relay.

6. An electrical time delay network comprising anode, cathode, and grid circuits for an electronic tube, a plurality of input terminals adapted to be connected to a source of operating voltage, a capacitor connected between said anode and grid circuits, said grid circuit comprising (1) a resistive impedance and (2) means for selectively establishing a charging and a discharging circuit for said capacitor from said capacitor to said source through selected ones of said input terminals, said impedance being included in at least one of said charging and discharging circuits, and an output circuit for said tube including voltage sensitive utilization means connected in said output circuit.

7. An electrical time delay network as defined in claim 6 wherein said impedance comprises a variable resistor included in said charging circuit.

8. An electrical time delay network as defined in claim 6 wherein said impedance comprises a variable resistor included both in said charging circuit and in said discharging circuit.

9. In an electrical time delay network, in combination, a plurality of input terminals adapted to be connected to a source of operating voltage, an electronic tube having anode, grid, and cathode electrodes, a capacitor connected between said anode and said grid, and a grid circuit for said tube comprising (1) a resistor and (2) means for selectively establishing a charging and a discharging circuit for said capacitor from said capacitor to said source through selected ones of said input terminals, said resistor being included in at least one of said charging and discharging circuits.

10. An electrical time delay network as defined in claim 9 wherein said charging circuit includes said resistor.

11. An electrical time delay network as defined in claim 9 wherein said resistor is included in said charging and said discharging circuits.

12. An electrical time delay network comprising an electronic tube having an anode, a grid, and a cathode, a capacitor connected between said anode and said grid, a source of operating voltage for said circuit, connections from said anode and said cathode to said source, a variable resistor connected between said grid and said source, means for charging said capacitor from said source through said resistor, means for discharging said capacitor, a second electronic tube comprising an anode, a cathode, and a control electrode, a current sensitive device connected in circuit with said second tube, means connecting said second tube across said source of voltage, and a connection between the grid of said second tube and the anode of said first tube.

13. An oscillatory relay control circuit comprising an electronic tube having an anode, a grid, and a cathode, a capacitor connected between said anode and said grid, a source of operating voltage for said circuit, connections from said anode and said cathode to said source, a variable resistor connected to said grid, switching means for establishing alternative circuits from said grid to first and second voltage points on said source, switching means coupled to said first named means and connected in parallel with said resistor for shorting said resistor when said first named switching means establishes a circuit to said first voltage point, and an output circuit for said tube including a current sensitive relay having an operating winding and a movable element adapted to be actuated by changes in current through said winding, said element being linked to said first named switching means and being adapted to cause actuation thereof in response to movement of said element.

STEPHEN V. HART.

REFERENCES CITED

The following references are of record in the file of this patent:

UNITED STATES PATENTS

| Number | Name | Date |
|---|---|---|
| 1,880,576 | Thomas | Oct. 4, 1932 |
| 1,973,123 | Stogoff | Sept. 11, 1934 |
| 2,150,440 | Hargreaves | Mar. 14, 1939 |
| 2,279,007 | Mortley | Apr. 7, 1942 |
| 2,412,485 | Whiteley | Dec. 10, 1946 |

FOREIGN PATENTS

| Number | Country | Date |
|---|---|---|
| 580,527 | Great Britain | Sept. 11, 1946 |